(12) United States Patent
Jang et al.

(10) Patent No.: US 7,438,834 B2
(45) Date of Patent: Oct. 21, 2008

(54) ANISOTROPIC CONDUCTIVE ADHESIVE HAVING PTC CHARACTERISTICS

(75) Inventors: Jong Yoon Jang, Anyang-si (KR); Yoon Jae Chung, Anyang-si (KR); Woo Young Ahn, Anyang-si (KR); Young Mi Jeon, Anyang-si (KR); Yong Seok Han, Anyang-si (KR)

(73) Assignee: LG Cable, Ltd., Seoul (KR)

( * ) Notice: Subject to any disclaimer, the term of this patent is extended or adjusted under 35 U.S.C. 154(b) by 407 days.

(21) Appl. No.: 11/110,312

(22) Filed: Apr. 20, 2005

(65) Prior Publication Data

US 2006/0118767 A1 Jun. 8, 2006

(30) Foreign Application Priority Data

Dec. 8, 2004 (KR) ................. 10-2004-0102831

(51) Int. Cl.
  *H01B 1/22* (2006.01)
(52) U.S. Cl. ...................... 252/512; 252/514
(58) Field of Classification Search .......... 252/512–514
  See application file for complete search history.

(56) References Cited

U.S. PATENT DOCUMENTS 4,120,828 A * 10/1978 Michalchik ................ 252/513
6,274,852 B1 * 8/2001 Blok et al. ................. 219/505
7,001,538 B2 * 2/2006 Lee et al. ................... 252/511
2001/0028953 A1 * 10/2001 Bluem et al. ........... 428/355 AC

* cited by examiner

*Primary Examiner*—Mark Kopec
(74) *Attorney, Agent, or Firm*—DeMont & Breyer, LLC

(57) ABSTRACT

The present invention relates to an anisotropic conductive adhesive comprising an anisotropic conductive adhesive combined with a crystalline polymer to realize anisotropic conductivity and PTC (Positive Temperature Coefficient) characteristics at the same time. The anisotropic conductive adhesive having PTC characteristics according to the present invention comprises an insulating adhesive component and a plurality of conductive particles dispersed in adhesive component, in which the insulating adhesive component comprises a crystalline polymer. Since the anisotropic conductive adhesive according to the present invention includes a crystalline polymer, when temperature rises and the volume expands, electrical resistance is rapidly increased, whereby current flow is intercepted resulting in blocking current, providing PTC characteristics acting as a switch. Thus, it shows circuit protection function as well. Accordingly, it is possible to intercept a circuit upon occurrence of excess current without using a separate element for circuit protection such as PTC thermistor.

12 Claims, No Drawings

ANISOTROPIC CONDUCTIVE ADHESIVE HAVING PTC CHARACTERISTICS

BACKGROUND OF THE INVENTION

1. Field of the Invention

The present invention relates to an anisotropic conductive adhesive, and more particularly, to an anisotropic conductive adhesive to which a crystalline polymer is added so that the anisotropic conductive adhesive has positive temperature coefficient (PTC) characteristics.

2. Background of the Related Art

The anisotropic conductive adhesive which is used in connection between an LCD (Liquid Crystal Display) and a flexible circuit board or a TAB (Tape Automated Bonding) film, connection between a TAB film and a printed circuit board and electrical and mechanical connection between a micro circuit such as a semiconductor IC and an IC-mounted circuit board, cannot prevent circuit damage due to an excess current by itself. Therefore, in order to prevent such circuit damage due to an excess current, it is necessary to use an element for circuit protection such as a PTC thermistor acting as a switch to intercept current flow by sudden increase of electrical resistance caused by volume expansion due to temperature rising. However, in order to cope with the recent trend toward thinness and lightness of electronic products, it is required to omit and retrench a separate device for circuit protection such as the PCT thermistor by realizing PTC characteristics in the conventional anisotropic conductive adhesive so that the anisotropic conductive adhesive act as a switch for circuit protection.

SUMMARY OF THE INVENTION

Therefore, the present invention has been made in view of the above problems, and it is an object of the present invention to provide an anisotropic conductive adhesive having PTC characteristics while preventing circuit damage upon generation of excess current by simultaneously realizing the PTC characteristics in the anisotropic conductive adhesive.

It is another object of the present invention to provide an anisotropic conductive adhesive having PTC characteristics while maintaining durability and reliability.

In order to achieve the above-described objects, the anisotropic conductive adhesive having PTC characteristics according to the present invention comprises an insulating adhesive component and a plurality of conductive particles dispersed in the adhesive component, in which the insulating adhesive component comprises a crystalline polymer.

The adhesive component of the anisotropic conductive adhesive according to the present invention is a component showing strong and firm adhesion to a substrate and may be various resins having adhesive power, particularly thermosetting resins or radical polymerizable compounds in terms of improvement in durability and reliability.

Also, the anisotropic conductive adhesive according to the present invention comprises a crystalline polymer for providing PTC characteristics.

The PTC characteristics which the anisotropic conductive adhesive according to the present invention has may be properly adjusted by temperature transition point of the added crystalline polymer, ratio of the crystalline polymer in the adhesive component, crystallinity of the crystalline polymer and the like in accordance with the characteristics of a technical field for the purpose of anisotropic conductive and PTC characteristics. Moreover, they can be, of course, adjusted by time and temperature of an adhesion process in which the anisotropic conductive adhesive comprising the adhesive component, the crystalline polymer and the conductive particles is applied.

The crystalline polymer provides PTC characteristics showing sudden increase of connection resistance at transition temperature of the polymer, only when it is added in an amount of 30 wt % to 70 wt % relative to the insulating adhesive component, and thus, is a very useful material for mechanical adhesion, electrical connection and circuit protection.

If the content of the crystalline polymer is less than 30 wt %, the resin composition has a thermal expansion rate which is too small to show PTC characteristics. If it exceeds 70 wt %, the cross-linking density of the resin is very small and thereby, durability or reliability against environment, where it used, is unsuitably reduced.

When the crystalline polymer is added, the additional rate is determined by a demanded level of durability or reliability of an applied material and PTC characteristics at a proper level may be obtained by adjusting curing density of the thermosetting resin according to the client reliability requirements. Generally, the content of the crystalline polymer is preferably in the range of 30 wt % to 70 wt % relative to the total weight of the composition and satisfactory characteristics are obtained when the resin has a melting point of 80° C. to 120° C.

Also, the crystalline polymer has preferably a crystallinity of 30% or more. If the crystallinity is less than 30%, the melting point of the polymer at which the volume suddenly changes is not clearly shown up and thus, it is difficult to provide PTC characteristics.

The crystalline polymer may include at least one selected from copolymers of a monomer having ester group, ether group, methylene group or polar group. The copolymers which can be used in the present invention include polyamide resins and polymethylmethacrylates, polyvinylbutyral resins and the like. Also, the crystalline polymers which can be used in the present invention may be divided into high melting point crystalline polymers such as high density polyethylene, medium density polyethylene and the like, medium melting point crystalline polymers such as low density polyethylene, linear low density polyethylene and the like, and low melting point crystalline polymer such as ethylene vinyl acetate, poly methyl acrylic acid, polyurethane and the like, according to their melting points. For the selection of the crystalline polymer, polarity and compatibility with the adhesive component of a subject to be adhered should be considered.

According to the present invention, the insulating adhesive component is a main component showing adhesive strength and may include thermosetting resins such as epoxy resins or radical polymerizable compounds. Among them, radical polymerizable compounds are preferably used in terms of low temperature rapid curing.

The radical polymerizable compounds are substances having a functional group capable of polymerizing by a radical and may include monomers and oligomers, or a combination thereof. Examples of the radical polymerizable compounds include acrylate type or methacrylate type compounds. In particular, acrylate or methacrylate type compounds having a dicyclopentenyl group and/or tricyclodecanyl group and/or triazine ring is preferably used since they have high thermal resistance. In addition, the radical polymerizable compounds may include maleimide compounds, unsaturated polyester, acrylic acid, vinylacetate, acrylonitrile, methacrylonitrile and the like. These radical polymerizable compounds may be used alone or in combination.

According to the present invention, when the radical polymerizable compounds are included as an insulating adhesive component, a polymerization initiator may be used together. The polymerization initiator activates the radical polymerizable compounds to form a polymeric net structure or a polymeric IPN structure. By such formation of cross-linking structure, the insulating adhesive component is cured. As the polymerization initiator, thermal polymerization initiator and/or photopolymerization initiator may be used and the content of the polymerization initiator is preferably 0.1 to 10 weight parts based on 100 weight parts of the radical polymerizable compounds, though it can be adjusted by type of a used radical polymerizable compounds and reliability and workability of an intended circuit adhesion process.

The thermal polymerization initiator is a compound which is decomposed by heating to generate a free radical and may include peroxide compounds, azo type compounds and the like, particularly, organic peroxide being preferred. The organic peroxide has O—O— bonding in the molecule and generate a free radical upon activation. Its usable examples include ketone peroxides, peroxyketals, hydroperoxides, dialkyl peroxides, diacyl peroxides, peroxy carbonates, peroxy esters and the like, with peroxy ketals and peroxy esters being preferred, considering the balance of preservation, curing and adhesion. These thermal polymerization initiators may be suitably selected to cure radical polymerizable compounds in a short period of time in accordance with a target connection temperature, connection time, effective time and the like.

Also, instead of the thermal polymerization initiator, a photopolymerization initiator may be used and be combinedly used with a radical polymerizable compound. Examples of the photopolymerization initiator include carbonyl compounds, sulfur-containing compounds and azo type compounds.

Also, in the anisotropic conductive adhesive according to the present invention, the insulating adhesive component may contain a thermoplastic resin such as a phenoxy resin, a polyester resin and the like. The thermoplastic resin includes styrene-butadiene copolymers, styrene-isoprene copolymers, saturated styrene-butadiene copolymers, saturated styrene-isoprene copolymers, styrene-ethylene-butene-styrene copolymers, acrylonitrile-butadiene copolymers, methylmethacrylate polymers, acryl rubber, phenoxy resins, polyester resins, polystyrene resins, thermoplastic epoxy resins and phenol resins. By using these thermoplastic resin, the anisotropic conductive adhesive can be prepared in the form of a film. Meanwhile, the resin preferably has a hydroxyl group or carboxyl group at the end because the adhesion is improved. These thermoplastic resins may be used alone or in combination.

Also, the adhesive component of the anisotropic conductive adhesive according to the present invention may further comprise a filler, a softening agent, an accelerator, a colorant, a flame retardant, a photostabilizer, a coupling agent, a polymerization blocking agent and the like, as needed. For example, addition of a filler may improve connection reliability and addition of a coupling agent may improve adhesion of the adhesive interface of the anisotropic conductive adhesive and adhesion strength, thermal resistance, moisture resistance, increasing connection reliability. Examples of such coupling agent include particularly a silane coupling agent, for example, beta-(3,4 epoxycyclohexyl)ethyltrimethoxysilane, gamma-mercaptopropyltrimethoxysilane, gamma-methacryloxypropyltrimethoxysilane and the like.

DETAILED DESCRIPTION OF THE PREFERRED EMBODIMENT

The conductive particles contained in the anisotropic conductive adhesive according to the present invention are explained.

As the conductive particles, any of those which can electrically connect between circuits may be used. Conductive particles, including a metal or such as nickel, iron, copper, aluminum, tin, zinc, chrome, cobalt, silver, gold and the like and a metal oxide, solder, carbon and the like, per se may be used or particles having a thin layer of a metal formed on the surface of the nuclear material such as glass, ceramic, polymer and the like by a thin layer forming method such as electroless plating may be used as the conductive particles. In particular, the conductive particles having a metal thin layer on the surface of the nucleus composed of a polymer is deformed in a pressing direction in the heat compression process, whereby the area contacting with an electrode is increased, improving electrical connection reliability. Also, conductive particles having the surface coated with an insulating resin may be used. The conductive particles has preferably a uniform particle diameter less than the space between circuit electrodes and the particle diameter is preferably 0.1 to 50 μm, more preferably 1 to 20 μm, and most preferably 2 to 10 μm. The content of the conductive particles is 0.1 wt % to 20 wt % based on the adhesive component. If the content of the conductive particles is less than 0.1 wt %, electrical conductivity is significantly reduced while if the content exceeds 20 wt %, a short may occur between electrodes due to excess of the conductive particles.

Now, the present invention will be described in further detail by preferred embodiments of the present invention and comparative examples to compare the conventional substances.

Example 1

Skythane UB 400 (a polyester type polyurethane resin, SK Chemicals) and ethylene glycol dimethylacrylate (Aldrich) were mixed in a weight rate of 60:40 to form 40% methylethylketone solution. To this solution, lauroyl peroxide (Aldrich) as a polymerization initiator and 5 micron nickel powder providing conductivity were added and thoroughly mixed. The resulting solution was coated on a PET film (50 micron) to a thickness of micron and dried 80° C. for 2 minutes, followed by evaluation.

Example 2

Skythane UB 310 (a polyester type polyurethane resin, SK Chemicals) and ethylene glycol dimethylacrylate (Aldrich) were mixed in a weight rate of 62:38 to form 40% methylethylketone solution. To this solution, lauroyl peroxide (Aldrich) as a polymerization initiator and 5 micron nickel powder providing conductivity were added and thoroughly mixed. The resulting solution was coated on a PET film (50 micron) to a thickness of 25 micron and dried 80° C. for 2 minutes, followed by evaluation.

Example 3

Skythane UB 410 (a polyester type polyurethane resin, SK Chemicals) and ethylene glycol dimethylacrylate (Aldrich) were mixed in a weight rate of 57:43 to form 40% methylethylketone solution. To this solution, lauroyl peroxide (Aldrich) as a polymerization initiator and 5 micron nickel powder providing conductivity were added and thoroughly mixed. The resulting solution was coated on a PET film (50 micron) to a thickness of 25 micron and dried 80° C. for 2 minutes, followed by evaluation.

Example 4

Skythane UB 420 (a polyester type polyurethane resin, SK Chemicals) and ethylene glycol dimethylacrylate (Aldrich) were mixed in a weight rate of 65:35 to form 40% methylethylketone solution. To this solution, lauroyl peroxide (Aldrich) as a polymerization initiator and 5 micron nickel powder providing conductivity were added and thoroughly mixed. The resulting solution was coated on a PET film (50 micron) to a thickness of 25 micron and dried 80° C. for 2 minutes, followed by evaluation.

COMPARATIVE EXAMPLES 1

Bekopox EP 401 (bisphenol A type epoxy resin, Vianova resins Co., Ltd.), YD-128 (bisphenol A type epoxy resin, Kukdo Chemical Co., Ltd.) and ethylene glycol dimethylacrylate (Aldrich) were mixed in a weight rate of 60:20:20 to form 40% methylethylketone solution. Then, benzoylperoxide was introduced in an amount of 20% based on the weight of ethylene glycol dimethylacrylate. Also, nickel powder having an average particle size of 5 micron was added in an amount of 5% of the total weight to provide conductivity. The resulting solution was coated on a PET film having a thickness of 50 micron to a thickness of 35 micron and dried 70° C. for 4 minutes.

The evaluation was performed by adhere FPC including a linear electrode having a pitch of 430 μm and PCT including an electrode having the same pitch using the above composition by compressing for 10 seconds until the temperature reached and measuring resistances at a high temperature and room temperature. Also, specimens were subjected to 90 degree peel test to examine adhesion power. The results of property measurements of Examples 1, 2, 3 and 4, and Comparative Example 1 are shown in Table 1. The measured properties were resistances at room temperature and a high temperature, PTC strength, maximum voltage, maximum operation current and adhesion power.

TABLE 1

| Properties | Resistance at room temperature* (mΩ) | Resistance at high temperature** (kΩ) | PTC strength (Rmax/Rmin) | Maximum voltage (Vmax) | Maximum operation current (mA) | Adhesion (gf/cm) |
|---|---|---|---|---|---|---|
| Example 1 | 41 | 697 | $1.7 \times 10^8$ | 83 | 2178 | 947 |
| Example 2 | 45 | 2251 | $3.4 \times 10^8$ | 120 | 2383 | 1083 |
| Example 3 | 57 | 431.7 | $4.2 \times 10^8$ | 73 | 2318 | 1024 |
| Example 4 | 46 | 364.3 | $5.8 \times 10^8$ | 70 | 2535 | 1184 |
| Comp. Example 1 | 52 | — | — | 113 | 3283 | 1273 |

*Resistance at room temperature, 25° C.
**Resistance at switching temperature, +20° C.

(1) A specimen was kept for 10 minutes at a temperature higher than the melting point of the thermoplastic resin polymer used in manufacture of an element for Examples and Comparative Example, cooled to room temperature and measured for resistance at room temperature. Then, resistance change according to temperature change of the element was measured by digital multimeter (Keithely 2000) while gradually increasing temperature around the element at a rate of 2° C./min. by using the resistance value change of the element, the ratio of the initial resistance value over the maximum resistance value was expressed as "PTC strength".

(2) In order to measure a hold current, an element was inserted into a circuit, and then a current stabilized in the element was measured while increasing applied voltage (DC voltage) at a step of 0.05 Volt. The voltage was continuously increased until the element was completely switched. While the applied voltage was increased, the maximum current passing through the element was designated as "maximum operation current (Imax)". If the voltage was increased over this point, reduction of current occurred.

(3) When an element was inserted into a circuit comprising a power supply apparatus and a resistant element regulating current to apply voltage (DC voltage) for 30 minutes, the voltage at which the element endure without making a spark nor catching fire, and separation of composition and electrodes was designated as "maximum voltage (Vmax)".

The According to the present invention, it is possible to provide an anisotropic conductive adhesive having PTC characteristics. Also, by using the anisotropic conductive adhesive, it is possible to intercept a circuit upon occurrence of excess current without a separate element for circuit protection such as PTC thermistor.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An anisotropic conductive adhesive having PTC characteristics, comprising an insulating adhesive component and a plurality of conductive particles dispersed in the insulating adhesive component,
    wherein the insulating adhesive component contains a crystalline polymer, the content of the crystalline polymer being 30 wt % to 70 wt %, relative to the insulating adhesive component, and
    wherein the insulating adhesive component includes a radical polymerizable compound and a polymerization initiator.

2. The anisotropic conductive adhesive according to claim 1, wherein the crystalline polymer has a melting point of 80° C. to 120° C.

3. The anisotropic conductive adhesive according to claim 1, wherein the crystalline polymer has a crystallinity of 30% or more.

4. The anisotropic conductive adhesive according to claim 1, in which the crystalline polymer comprises a copolymer that includes a monomer selected from the group consisting of an ester group, an ether group, a methylene group, and a polar group.

5. The anisotropic conductive adhesive according to claim 1, wherein the radical polymerizable compounds is an acrylate type or methacrylate type compounds.

6. The anisotropic conductive adhesive according to claim 1, wherein the polymerization initiator is a thermal polymerization initiator and/or a photopolymerization initiator.

7. The anisotropic conductive adhesive according to claim 6, wherein the content of the polymerization initiator is 0.1 to 10 weight parts based on 100 weight parts of the radical polymerizable compounds.

8. The anisotropic conductive adhesive according to claim 6, wherein the thermal polymerization initiator is peroxide compounds or azo type compounds.

9. The anisotropic conductive adhesive according to claim 1, wherein the insulating adhesive component further includes a thermoplastic resin.

10. The anisotropic conductive adhesive according to claim 9, wherein the thermoplastic resin includes at least one selected from the group consisting of styrene-butadiene copolymers, styrene-isoprene copolymers, saturated styrene-butadiene copolymers, saturated styrene-isoprene copolymers, styrene-ethylene-butene-styrene copolymers, acrylonitrile-butadiene copolymers, methylmethacrylate polymers, acryl rubber, phenoxy resins, polyester resins, polystyrene resins, thermoplastic epoxy resins and phenol resins.

11. The anisotropic conductive adhesive according to claim 9, in which the insulating adhesive component further includes at least one selected from the group consisting of a filler, a softening agent, an accelerator, a colorant, a flame retardant, a photostabilizer, a coupling agent, and a polymerization blocking agent.

12. The anisotropic conductive adhesive according to claim 11, in which the coupling agent includes a silane coupling agent selected from the group consisting of beta-(3,4 epoxycyclohexyl)ethyltrimethoxysilane, gamma-mercaptopropyltrimethoxysilane, and gamma-methacryloxypropyltrimethoxysilane.

* * * * *